(12) United States Patent
Kraft et al.

(10) Patent No.: US 6,607,985 B1
(45) Date of Patent: *Aug. 19, 2003

(54) GATE STACK AND ETCH PROCESS

(75) Inventors: Robert Kraft, Plano, TX (US); Scott H. Prengle, Plano, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/014,729

(22) Filed: Jan. 28, 1998

Related U.S. Application Data

(60) Provisional application No. 60/036,799, filed on Jan. 31, 1997.

(51) Int. Cl.$^7$ .............................................. H01L 21/302
(52) U.S. Cl. ...................... 438/706; 438/710; 438/712
(58) Field of Search ............................... 438/706, 710, 438/711, 712, 718, 720, 721, 724

(56) References Cited

U.S. PATENT DOCUMENTS

| | | | | |
|---|---|---|---|---|
| 5,401,356 A | | 3/1995 | Enami et al. ............ 156/643 |
| 5,543,362 A | * | 8/1996 | Wu ......................... 438/303 |
| 5,605,858 A | * | 2/1997 | Nishioka .................. 437/60 |
| 5,679,591 A | * | 10/1997 | Lin et al. ................. 438/257 |
| 5,897,349 A | * | 4/1999 | Agnello .................... 438/230 |
| 5,935,877 A | * | 8/1999 | Autryve ................... 438/743 |

FOREIGN PATENT DOCUMENTS

| | | | |
|---|---|---|---|
| EP | 0 28 794 | 10/1988 | ......... H01L/21/285 |
| EP | 0 284 794 | * 10/1988 | |
| WO | WO 96/27899 | 9/1996 | ......... H01L/21/321 |

OTHER PUBLICATIONS

Patent Abstracts of Japan, vol. 095, No. 011, Dec. 26, 1995 & JP 07 202189 A, Aug. 4, 1995 *abstract* (Toshiba Corp).

Patent Abstracts of Japan, vol. 018, No. 280 (E–1555), May 27, 1994 & JP 06 053494 A, Feb. 25, 1994 *abstract* (NEC Corp).

Patent Abstracts of Japan, vol. 095, No. 006, Jul. 31, 1995 & JP 07 066176 A, Mar. 10, 1995 *abstract* (Sony Corp).

* cited by examiner

*Primary Examiner*—Benjamin L. Utech
*Assistant Examiner*—Lan Vinh
(74) *Attorney, Agent, or Firm*—Jacqueline J. Garner; W. James Brady, III; Frederick J. Telecky, Jr.

(57) ABSTRACT

A five step, low pressure, high-density-plasma etch process used to etch complicated DRAM transistor gate stacks with high inter-layer selectivity. Such stacks typically consist of the following layers: silicon nitride (310), tungsten (320), titanium nitride (330), and polysilicon (340). The process includes one step for each of the four layers in the gate stack, and one step to ash the photoresist. These five process steps can preferably be performed in four separate chambers on a cluster tool platform. The innovative etch process of the present invention fabricates gates with lengths of 0.25 microns and below with excellent profile, excellent linewidth uniformity across the wafer, and minimal loss of the gate oxide.

8 Claims, 4 Drawing Sheets

SiN ETCH

SiN ETCH

GATE STACK AND ETCH PROCESS

This is a Non Provisional application filed under 35 USC 119(e) and claims priority of prior provisional, Serial No. 60/036,799 of inventor Kraft et al., filed Jan. 31, 1997.

BACKGROUND AND SUMMARY OF THE INVENTION

The present invention relates to integrated circuit gate structures which contain unreacted metal, and to methods for fabricating such structures.

One of the driving forces in shrinking integrated circuit geometries is the distributed resistance and parasitic capacitance of the signal lines, which reduce the propagation speed of signals. The additional delays thus introduced reduce the potential speed of the chip.

This is a particular problem for DRAMs, since the wordlines are densely packed together, and the capacitive coupling between adjacent lines becomes very significant. Moreover, the sheet resistance of the lines cannot usefully be improved by increasing the height of the lines, since this also increases the capacitive coupling between adjacent lines. There has therefore been great pressure to find materials with a lower resistivity to replace the traditional polysilicon/silicide lines. This has impelled efforts to design metal into the gate line structure. One example of this is a gate stack structure which includes tungsten over a metal nitride over polysilicon, but many other gate stack structures have been proposed.

A further difficulty with gate stack etching is that some topography is present, since with conventional isolation technologies the gate stack will be higher atop field oxides than on the active (moat) areas. Thus a substantial amount of overetch is required to fully clear the gate stack from the areas to be etched.

However, complicated DRAM transistor gate stacks have proved difficult to etch. Previous etches have lower interlayer selectivities and lower etch uniformity. These etches will only work on stacks with a thick polysilicon layer and minimal wafer topography where it is possible to stop in the polysilicon layer before exposing and removing the gate oxide and then switching to the polysilicon etch step. Previous etches also do not have the profile control required to etch gates with lengths of 0.25 microns and below.

Stack Etch Process

The proposed etch process overcomes the above difficulties by utilizing an integrated set of low pressure, high-density-plasma process conditions with high inter-layer selectivity. The proposed highly selective and uniform etch process can stop in a thin (sub-100 nm) polysilicon layer even with LOCOS topography which requires a 100 percent over-etch of each layer in the DRAM stack to clear stringers at the moat boundary.

The advantages of the proposed etch process include:
excellent etch rate uniformity across the wafer (<3 percent typical non-uniformity);
high etch selectivity between the gate stack layers (silicon nitride:tungsten 2.4:1, tungsten:titanium nitride 5.5:1, polysilicon:oxide 420:1);
possible to perform long over-etches (100 percent) of the individual layers which is required with severe wafer topography;
gate profiles are nearly 90 degrees on 0.25 micron gates;
minimal gate oxide loss (<2 nanometers typically); gate lengths are very uniform across the wafer surface; and high throughput process if performed on a cluster platform.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
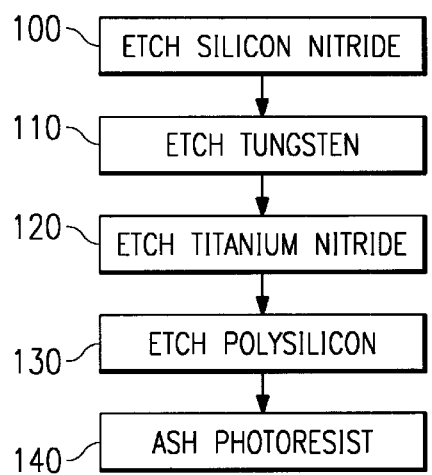
FIG. 1 shows an innovative process flow for etching complicated gate stacks.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The proposed process is preferably used to etch complicated DRAM transistor gate stacks. As an example, such stacks can consist of the following layers: silicon nitride, tungsten, titanium nitride, and polysilicon. These gate stacks have potential application in 256 Megabit and higher DRAM products which require low resistance wordlines. The thickness of the materials for a typical 256 Megabit gate stack are: silicon nitride 150 nm, tungsten 60 nm, titanium nitride 20 nm, polysilicon 90 nm, and gate silicon dioxide 8 nm. The innovative etch process of the present invention fabricates gates with lengths of 0.25 microns and below with excellent profile, excellent linewidth uniformity across the wafer, and minimal loss of the gate oxide.

The proposed etch process overcomes the above difficulties by utilizing an integrated set of low pressure, high-density-plasma process conditions with high inter-layer selectivity. The disclosed highly selective and uniform etch process can stop in a 90 nm polysilicon layer even with 200 nm of LOCOS topography which requires a 100 percent over-etch of each layer in the DRAM stack to clear stringers at the moat boundary.

As shown in FIG. 1, the innovative process of the present invention uses a five step, low pressure, high-density-plasma etch process with one step for each of the four layers in the gate stack, and one step to ash the photoresist. These five process steps can preferably be performed in three separate chambers on a cluster tool platform.

In the first chamber, the silicon nitride portion of the stack is etched (step 100). In the second chamber, the tungsten (step 110) and titanium nitride (step 120) is etched. In the third chamber, the polysilicon is etched (step 130). In the fourth chamber, the photoresist is ashed (step 140), thus completing the process.

Figure 2:
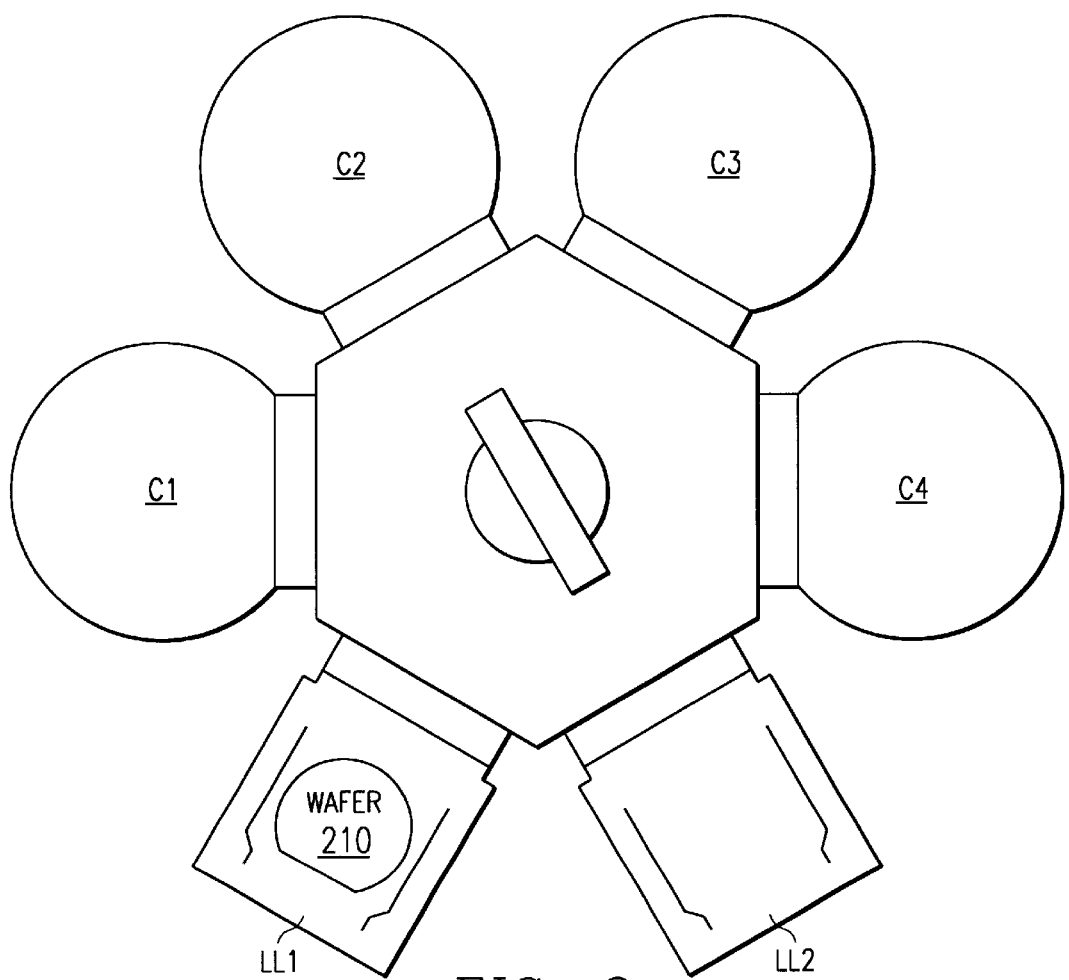
FIG. 2 shows a top view of a cluster tool.
Figure 3A:
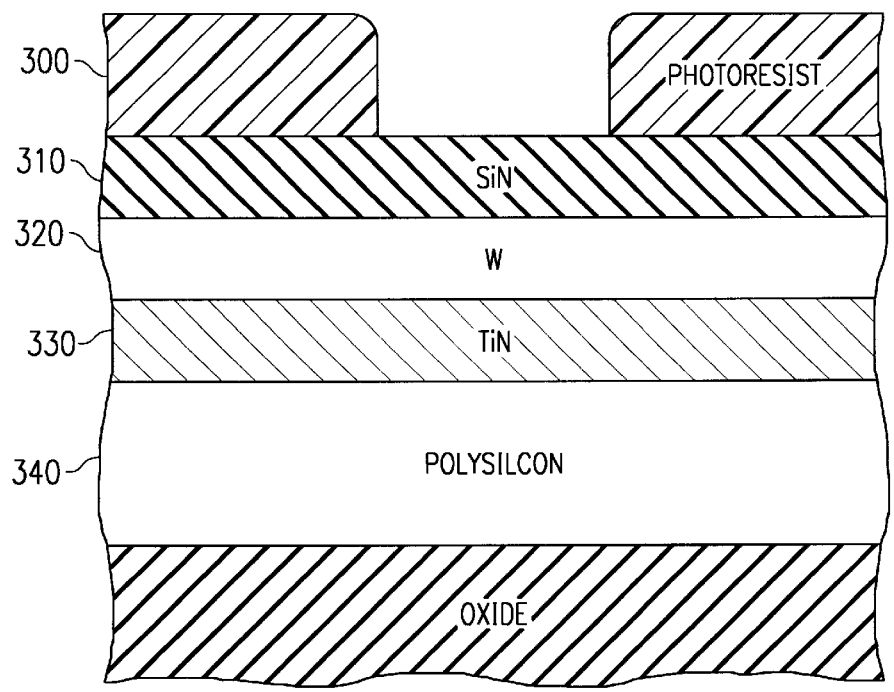
FIGS. 3A–3F show a stack etch in accordance with preferred embodiments of the present invention.
Figure 3B:
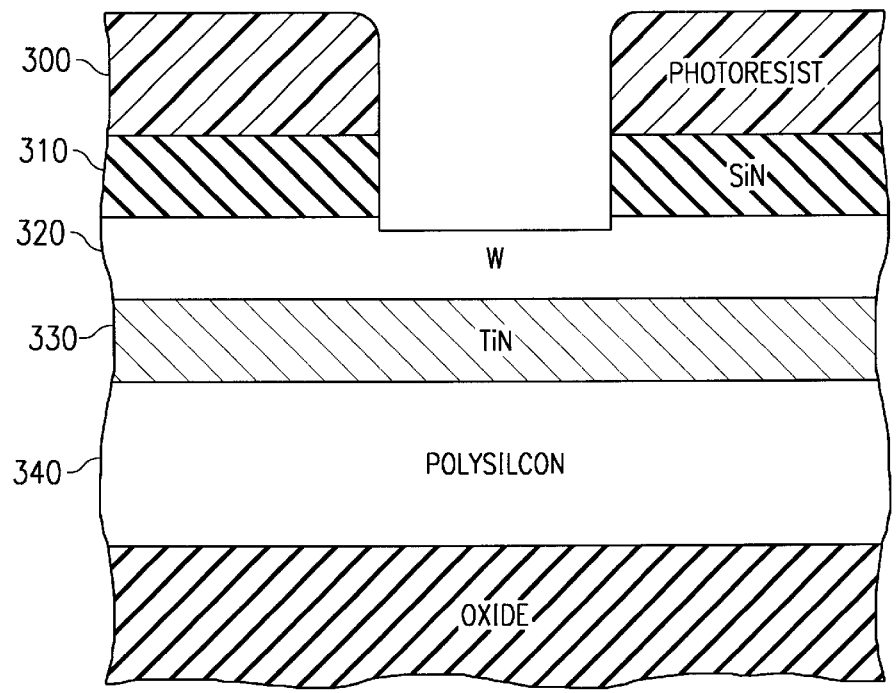
Figure 3C:
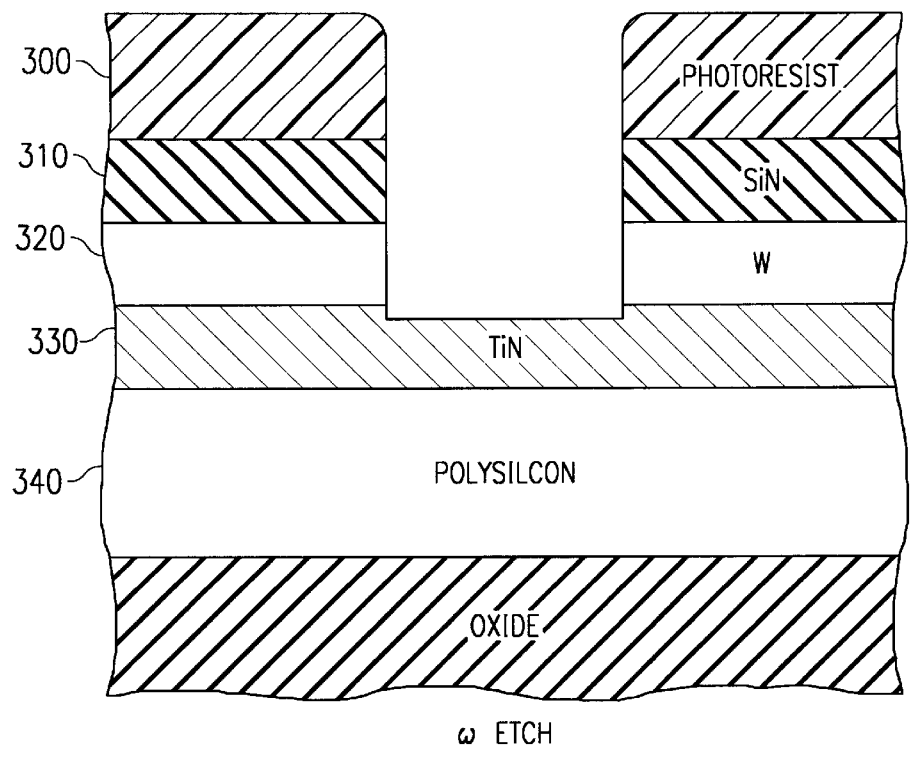
Figure 3D:
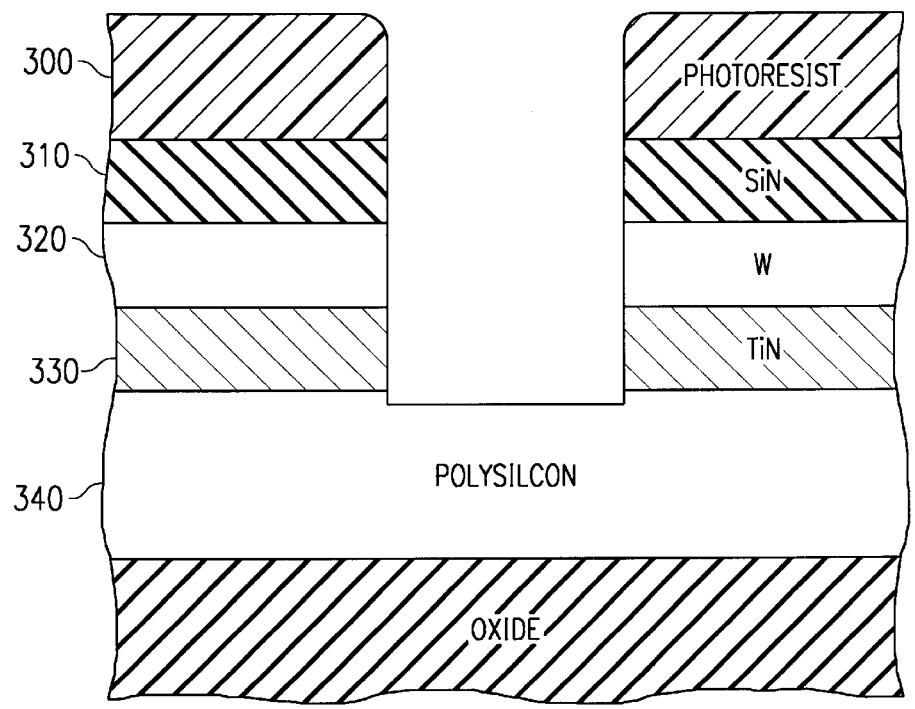
Figure 3E:
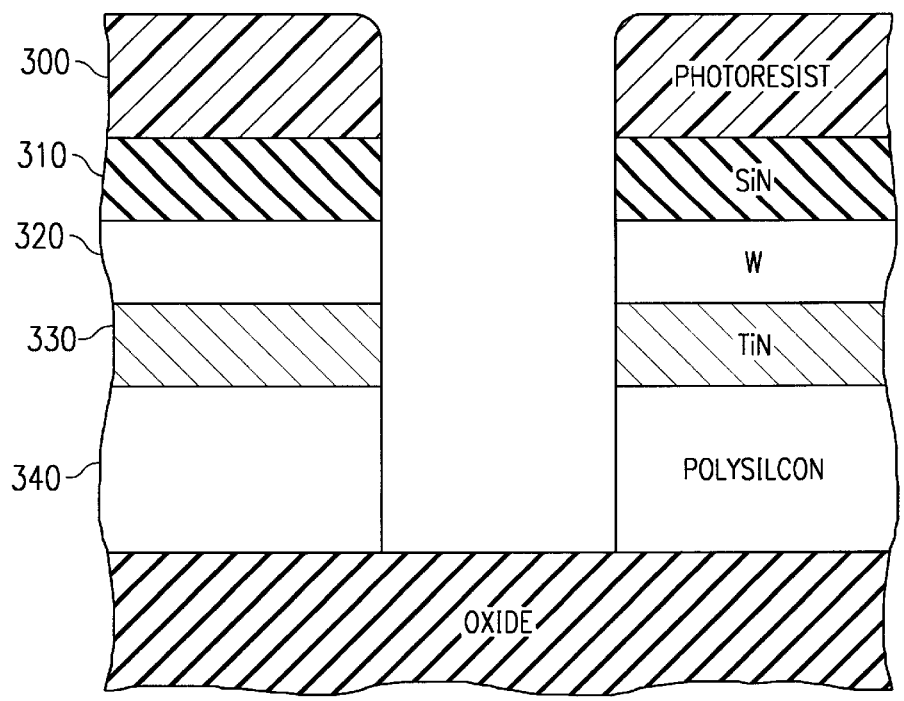
Figure 3F:
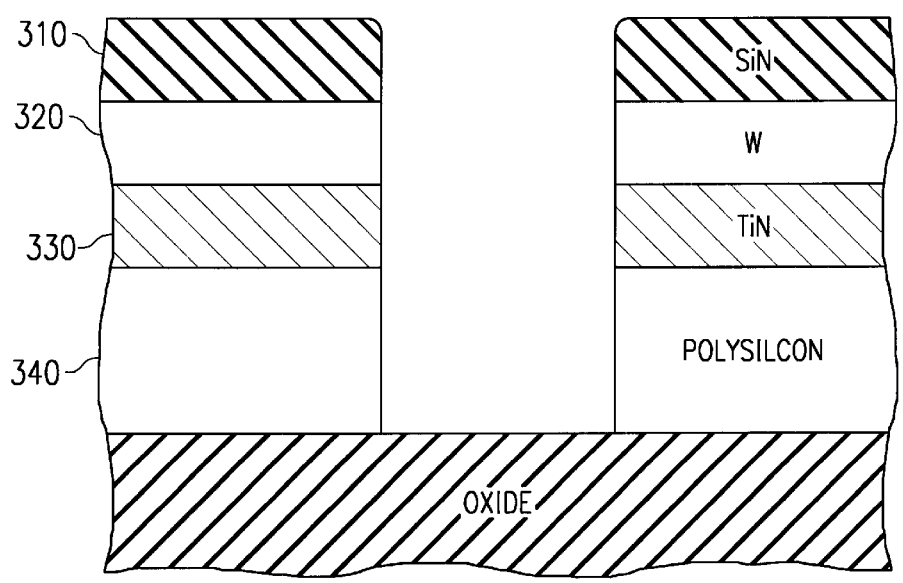

A top view of a typical cluster tool which can be employed in the innovative process of the present invention is shown in FIG. 2. Four separate chambers C1, C2, C3, and C4 are shown for processing wafers. Two loadlocks LL1 and LL2 are shown, with a wafer (210) shown in LL1. In the center of the cluster tool is shown wafer handling equipment (220).

The multi-chamber cluster approach enables high throughput since the wafers are maintained under vacuum throughout the etch process. The process will also be more stable since each chamber allows only one or two etch chemistries and etched materials. Metal contamination of the gate oxide is also minimized by having the tungsten and titanium nitride removed before the wafers get to the polysilicon etch chamber.

A preferred embodiment of the stack etch process of the resent invention is shown in FIGS. 3A–3F. As can be seen, the photoresist 300 masks the underlying SiN layer 310 for the first etch.

The following tables give specific results from actual test runs using sample embodiments of the innovative process described herein, in the specific context of the presently preferred embodiment. It must be understood that these specific values are given merely to provide a wealth of detail regarding the preferred embodiment, and for better understanding of FIGS. 1 and 3A–3F, and do not by any means delimit necessary features of the invention.

The following sample parameters are given for a six-inch wafer:

ETCH CHAMBER 1

STEP 1 SILICON NITRIDE ETCH

| | |
|---|---|
| Source Power | 2000 Watts |
| Bias Power | 100 Watts |
| Pressure | 6 mTorr |
| Wafer He Back-pressure | 10 Torr |
| Wafer Temp | 23 degrees C. |
| CF4 Flow | 50 sccm |
| Si3N4 Etch Rate | 4.6 nm/sec |
| Si3N4 Etch Rate Uniformity | 2 percent, 1-Sigma |
| W Etch Rate | 1.9 nm/sec |
| Si3N4 to W Selectivity | 2.41 Si3N4 ER:W ER |
| Si3N4 Over-etch | 50 percent of orig. film |

ETCH CHAMBER 2

STEP 2 TUNGSTEN ETCH

| | |
|---|---|
| Source Power | 1700 Watts |
| Bias Power | 23 Watts |
| Pressure | 6 mTorr |
| Wafer He Back-pressure | 10 Torr |
| Wafer Temperature | 23 degrees C. |
| SF6 Flow | 93 sccm |
| N2 Flow | 14 sccm |
| W Etch Rate | 5 nm/sec |
| W Etch Rate Uniformity | 3 percent, Sigma |
| TiN Etch Rate | 0.9 nm/sec |
| W to TiN Selectivity | 5.5:1 W ER:TiN ER |
| W Over-etch | 100 percent or more |

STEP 3 TITANIUM NITRIDE ETCH

| | |
|---|---|
| Source Power | 1500 Watts |
| Bias Power | 20 Watts |
| Pressure | 6 mTorr |
| Wafer He Back-pressure | 10 Torr |
| Wafer Temperature | 23 degrees C. |
| Ar Flow | 150 sccm |
| Cl2 Flow | 30 sccm |
| TiN Etch Rate | 3 nm/sec |
| Polysilicon Etch Rate | 3 nm/sec |
| TiN to Polysilicon Selectivity | 1:1 TiN ER:Polysilicon ER |
| TiN Over-etch | 100 percent of orig. film |

ETCH CHAMBER 3

STEP 4 POLYSILICON ETCH

| | |
|---|---|
| Source Power | 1000 Watts |
| Bias Power | 28 Watts |
| Pressure | 6 mTorr |
| Wafer He Back-pressure | 10 Torr |
| Wafer Temperature | 23 degrees C. |
| HBr Flow | 10 sccm |
| Cl2 Flow | 30 sccm |
| 80 percent He/20 percent O2 Flow | 35 sccm |
| Poly Etch Rate | 210 nm/min |
| Poly Etch Rate Uniformity | 3 percent, 1-Sigma |
| Oxide Etch Rate | 0.5 nm/min |
| Oxide Etch Rate Uniformity | 7.5 percent, 1-Sigma |
| Poly to Oxide Selectivity | 420:1 Poly ER:Oxide ER |
| Poly Over-etch | 100 percent of orig. film |

ETCH CHAMBER 4

STEP 5 PHOTORESIST ASH

| | |
|---|---|
| Source Power | 2750 Watts |
| Bias Power | 0 Watts |
| Pressure | 6 mTorr |
| Wafer He Back-pressure | 10 Torr |
| Wafer Temperature | 23 degrees C. |
| O2 Flow | 100 sccm |
| Photoresist Etch Rate | 1,000 nm/min |
| Photoresist Etch Rate Uniformity | 2 percent, 1-Sigma |
| Photoresist Over-etch | 100 percent of orig. film |

Note that the bias power levels during some of these stages are very low. In the example given above, the ratio of source to bias power is 74:1 during the tungsten etch and 75:1 during the titanium nitride etch. These are merely examples of low-bias etching conditions, but in the present application any ratio of source power to bias power which is greater than 30:1 will be referred to as a low-bias etching condition.

Of course, the specific etch chemistries used are not exclusive. For steps 1–2 above, other fluorine based chemistries can optionally be substituted, while for steps 3 and 4, other chlorine source gasses can optionally be substituted for C12.

Alternate Embodiment

The conditions of this alternate embodiment are similar to the parameters shown above, but in the silicon nitride etch, CF4 is replaced by BF3. Additionally, during both the titanium nitride etch and the polysilicon etch, BCl3 is used as the chlorine source. Both the titanium nitride etch and the polysilicon etch are low-bias etches.

Further Alternate Embodiment

The conditions of this alternate embodiment are similar to the parameters shown for the first alternate embodiment above, with NF3 being used instead of BF3 in the nitride etch.

Further Alternate Embodiment

In this further alternate embodiment, TiAlN is used in the stack to replace TiN. In this embodiment, the etch chemistries would remain essentially the same as the detailed embodiment above.

The dense and isolated gate lengths are extremely uniform across the wafer surface. The following table illustrates the pre and post results.

Dense Lines

Pre-etch average: 0.270 micron lines, 0.230 micron Spaces;
Post-etch average: 0.262 micron lines.
Pre-etch 3-sigma range: 0.019 micron;
Post-etch 3-sigma range: 0.016 micron.

Isolated Lines pre-etch average: 0.228 micron;
post-etch average: 0.197 micron;
pre-etch 3-sigma range: 0.014 micron;
post-etch 3-sigma range: 0.012 micron.

Processing continues with conventional steps to complete fabrication, e.g. deposition and planarization of further inter-level dielectric, via patterning, second metal deposition and etch, protective overcoat deposition, etching contact pad apertures, etc.

According to a disclosed class of innovative embodiments, there is provided: a method of etching a gate stack which includes a layer of metal over a conductive metal nitride layer over a layer of polycrystalline material predominantly comprising silicon, said method comprising the steps of: a) patterning and etching said layer of metal under low-bias plasma etching conditions, with a selectivity to said metal nitride layer of more than 5:1; b) after said step (a.), etching said metal nitride layer, under low-pressure high-density plasma conditions, where exposed by said metal layer; c) after said step d, etching said polycrystalline material, under low-pressure high-density plasma conditions, where exposed by said metal nitride layer.

According to another disclosed class of innovative embodiments, there is provided: a method of etching a DRAM stack which includes a layer comprising silicon and nitrogen over a layer of metal comprising tungsten over a metal nitride layer comprising titanium over a layer of polycrystalline material predominantly comprising silicon, said method comprising the steps of: a) etching said silicon and nitrogen layer using a patterned photoresist layer in a first chamber of a multi-chamber cluster tool; b) fluoro-etching said layer of metal, where exposed by said patterned photoresist layer, under low-bias conditions, in a second chamber of said multi-chamber cluster tool; and c) etching said metal nitride layer, where exposed by said patterned photoresist layer, under low-bias conditions, in a second chamber of said multi-chamber cluster tool; and d) after said step c, etching said polycrystalline material, where exposed by said patterned photoresist layer, in a third chamber of said multi-chamber cluster tool.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Of course a variety of materials, and of combinations of materials, can be used to implement the metal layer. In addition, the specific etch chemistries, layer compositions, and layer thicknesses given are merely illustrative, and do not by any means delimit the scope of the claimed inventions.

The innovative process teachings can be used in 1 Gigabit (0.18 micron) applications. In addition, the process may also be adapted for contact formation in bipolar or other device technologies.

Of course, the specific etch chemistries, layer compositions, and layer thicknesses given are merely illustrative, and do not by any means delimit the scope of the claimed inventions.

What is claimed is:

1. A method of fabricating an electronic device on a semiconductor substrate, said method comprising the steps of:

forming a gate insulator on said substrate, said gate insulator having a thickness;

forming a silicon-containing layer on said gate insulator, said silicon containing layer having a thickness;

forming a layer comprised of titanium and nitride on said silicon containing layer, said layer comprised of titanium and nitride having a thickness;

forming a layer comprised of tungsten on said layer comprised of titanium and nitride, said layer comprised of tungsten having a thickness;

forming a layer comprised of silicon and nitride on said layer comprised of tungsten, said layer comprised of silicon and nitride having a thickness;

patterning and selectively etching said layer comprised of silicon and nitride to expose a portion of said layer comprised of tungsten, said step of selectively etching of said layer comprised of silicon and nitride being selective against etching said layer comprised of tungsten;

selectively etching said exposed portion of said layer comprised of tungsten substantially simultaneously with etching a portion of said layer comprised of titanium and nitride so as to expose a portion of said silicon containing layer, said step of selectively etching said exposed portion of said layer comprised of tungsten being selective against etching said layer of comprised $_1$f silicon and nitride; and then, selectively etching said exposed portion of said silicon-containing layer so as to expose a portion of said gate insulator, said step of selectively etching said exposed portion of said silicon-containing layer being selectively against etching said layer comprised of titanium and nitride, said layer comprised of tungsten, and said layer comprised of silicon and nitride substantially unetched.

2. The method of claim 1, wherein said thickness of said gate insulator is around 8 nm.

3. The method of claim 1, wherein said thickness of said silicon-containing layer is around 90 nm.

4. The method of claim 1, wherein said thickness of said layer comprised of titanium and nitride is around 20 nm.

5. The method of claim 1, wherein said thickness of said layer comprised of tungsten is around 60 nm.

6. The method of claim 1, wherein said thickness of said layer comprised of silicon and nitride is around 150 nm.

7. A method of fabricating an electronic device on a semiconductor substrate, said method comprising the steps of:

forming a gate insulator on said substrate, said gate insulator having a thickness;

forming a polysilicon layer on said gate insulator, said polysilicon layer having a thickness around 90 nm;

forming a layer of titanium nitride on said polysilicon layer, said layer of titanium nitride having a thickness around 20 nm;

forming layer comprised of tungsten on said layer of titanium nitride, said layer comprised of tungsten having a thickness around 60 nm;

forming a layer of silicon nitride on said layer comprised of tungsten, said layer of silicon nitride having a thickness around 150 nm;

patterning and selectively etching said layer of silicon nitride to expose a portion of said layer comprised of tungsten, said step of selectively etching of said layer of silicon nitride being selective against etching said layer comprised of tungsten and including an overetch of around 50%;

selectively etching said exposed portion of said layer comprised of tungsten including the step of an overetch of at least 100%;

selectively etching a portion of said layer of titanium nitride so as to expose a portion of said polysilicon layer, said step of selectively etching a portion of said layer of titanium nitride including an overetch at least 100%; and then selectively etching said exposed portion of said polysilicon layer so as to expose a portion of said gate insulator, said step of selectively etching said exposed portion of said polysilicon layer being selectively against etching said gate insulator and including an overetch of at least 100%.

8. A method of fabricating an electronic device on a semiconductor substrate, said method comprising the steps of:

forming a stack on said substrate, said stack comprising a layer of silicon nitride on a layer of tungsten on a layer of titanium nitride on a layer of polysilicon on a gate insulator;

patterning and selectively etching said silicon nitride layer to expose a portion of said tungsten layer, said step of selectively etching said silicon nitride layer being selective against etching said tungsten layer and including an overetch of around 50%;

selectively etching said exposed portion of said tungsten layer including the step of an overetch of at least 100%;

selectively etching a portion of said titanium nitride layer so as to expose a portion of said polysilicon layer, said step of selectively etching a portion of said titanium nitride layer including an overetch at least 100%; and then selectively etching said exposed portion of said polysilicon layer so as to expose a portion of said gate insulator, said step of selectively etching said exposed portion of said polysilicon layer being selectively against etching said gate insulator and including an overetch of at least 100%.

* * * * *